United States Patent [19]

Tsuno et al.

[11] Patent Number: 5,004,918
[45] Date of Patent: Apr. 2, 1991

[54] DIFFERENTIAL PHASE CONTRAST SCANNING TRANSMISSION ELECTRON MICROSCOPE

[75] Inventors: Katsushige Tsuno; Masao Inoue, both of Tokyo, Japan

[73] Assignee: Jeol Ltd., Tokyo, Japan

[21] Appl. No.: 468,750

[22] Filed: Jan. 24, 1990

[30] Foreign Application Priority Data

Jan. 25, 1989 [JP] Japan .................................. 1-15590

[51] Int. Cl.[5] .......................................... H01J 37/28
[52] U.S. Cl. .................................. 250/311; 250/307; 250/397
[58] Field of Search ............... 250/311, 310, 397, 398, 250/307

[56] References Cited

U.S. PATENT DOCUMENTS

| | | | |
|---|---|---|---|
| 3,225,192 | 12/1965 | Katagiri et al. | 250/311 |
| 3,500,043 | 3/1970 | Hanssen | 250/311 |
| 3,908,124 | 9/1975 | Rose | 250/311 |
| 4,149,074 | 4/1979 | Schliepe et al. | 250/311 |
| 4,382,182 | 5/1983 | Maksuzaka et al. | 250/311 |
| 4,691,103 | 9/1987 | Le Poole et al. | 250/311 |

OTHER PUBLICATIONS

"Double Gap Objective Lens for Observing Magnetic Domains by Means of Differential Phase Contrast Electron Microscopy", K. Tsuno and M. Inoue, Optik 67, No. 4 (1984), pp. 363–376.

Primary Examiner—Jack I. Berman
Assistant Examiner—Kiet T. Nguyen
Attorney, Agent, or Firm—Webb, Burden, Ziesenheim & Webb

[57] ABSTRACT

A differential phase contrast scanning transmission electron microscope capable of obtaining a clear differential phase contrast image. This microscope includes a charge-coupled image sensor on which a diffraction image is projected. The region covered by the image sensor is divided into two parts by a straight line. The difference between the amounts of electrons impinging on these two parts is calculated, and the resulting differential signal is supplied to a display unit to display an image of the specimen.

4 Claims, 5 Drawing Sheets

FIG. 5

DIFFERENTIAL PHASE CONTRAST SCANNING TRANSMISSION ELECTRON MICROSCOPE

FIELD OF THE INVENTION

The present invention relates to a differential phase contrast (DPC) scanning transmission electron microscope capable of creating clear phase contrast images of a specimen.

BACKGROUND OF THE INVENTION

As a method of observing magnetic domains of a ferro-magnetic substance with an electron microscope, a differential phase contrast (DPC) scanning transmission electron microscopy using a scanning transmission electron microscope (STEM) is described in *Optik*, West Germany, 67, No. 4 (1984), pp. 363-376.

The differential phase contrast scanning transmission electron microscopy is a straightforward method for creating an image from information about phase contrast. As an example, a detector that is divided into two portions is used to detect a transmitted electron beam. The difference between the output signals from the two detector portions is supplied as an image signal to a cathode-ray tube. As a result, a scanning transmission electron micrograph is obtained. This method can give rise to excellent images when phase contrast is created from topographical features or magnetic domains which images are difficult to create by any other method.

FIG. 1 schematically shows the electron optical system of a scanning transmission electron microscope. An electron beam emitted by an electron gun G is focused onto a specimen 3 by a condenser lens 2a, objective lens 2b disposed ahead of the specimen 3. A scan coil 1 which receives a scanning signal from a scanning circuit 22 causes the focused beam to scan an area of the surface of the specimen 3. When the electrons of the beam pass through the specimen 3, they are scattered in various directions. As a result, a diffraction image of the specimen is created by an imaging objective lens 4 in the back focal plane 5 of the objective lens 4. The position of the focused diffraction image is independent of the irradiated position on the specimen 3 but depends on the directions in which the electrons are scattered, as shown in FIG. 2. In FIG. 2, electrons scattered through angle $\theta$ by the specimen 3 are focused at position A, irrespective of where they impinged upon the specimen 3. Electrons scattered through angle $\phi$ by the specimen 3 are focused at position B. Those electrons which were not scattered by the specimen 3 and traveled straight are focused at position 0. Thus, it can be seen that the diffraction image focused onto the back focal plane 5 contains information about the phase difference created by the specimen 3.

Then, the diffraction image focused onto the back focal plane is magnified and projected onto two detectors 8 and 9 by an intermediate lens 6 and a projector lens 7 which are disposed behind the back focal plane. At this time, an electron micrograph of the specimen 3 is imaged at a reduced magnification between the projector lens 7 and the array of the detectors 8, 9.

Referring again to FIG. 1, the specimen shown has magnetic domains. It is now assumed that the electron beam falls on neighboring magnetic domains 10 and 11 whose magnetization directions have an antiparallel relation to each other. The paths of electron rays passing through the magnetic domains 10 and 11 are indicated by the solid lines and the broken lines, respectively. The bold, solid and light, solid lines indicate rays deflected by the Lorentz force produced by the magnetic domains, while the solid and the broken line indicates undeflected rays.

When the electron beam hits the right magnetic domain 10, the diffraction image is shifted toward the detector 9 as indicated by 20 in FIG. 3(a). When the beam impinges on the left domain 11, the diffraction image is shifted toward the detector 8 as indicated by 21 in FIG. 3(b). Therefore, if a signal proportional to the difference between the output signal A from the detector 8 and the output signal B from the detector 9 is produced by a differential amplifier 23, the signal components contributed to the phase difference are summed up, whereas the signal components which are not related to the phase difference are canceled out by the amplifier 23, because the magnitudes of the latter components detected by both detectors remain the same (see the solid and the broken lines in FIG. 1).

Thus, the scan coil 1 causes the electron beam to scan the surface of the specimen in two dimensions. The differential amplifier 23 produces a signal proportional to the difference between the output signal A from the detector 8 and the output signal B from the detector 9. The differential signal from the amplifier 23 is fed as an image signal to a cathode-ray tube 24 synchronized with the scan of the electron beam on the specimen. In this way, a differential phase contrast image Z is presented on the viewing screen of the CRT 24. This image Z contains various levels of brightness, corresponding to various magnetization directions of the magnetic domains produced on the specimen.

The detector can be split into two as shown in FIGS. 3(a) and 3(b) or into four as shown in FIG. 3(c). In the latter case, output signals A, B, C, D from detectors 15, 16, 17, 18, respectively, are so treated that the calculation given by $(A+D)-(B+C)$, for example, is performed to obtain a phase difference.

In order to obtain a clear differential phase contrast image, it is desired that diffraction images 20 and 21 be symmetrically projected onto the two detectors 8 and 9, as shown in FIG. 4(a). Although a differential phase contrast image can be observed even if the diffraction images 20 and 21 deviate slightly from the centers of the detectors 8 and 9, respectively, as shown in FIG. 4(b), the asymmetry leaves behind unwanted information after the arithmetic operation and, therefore, it is impossible to derive a clear differential phase contrast image. Especially, where the diffraction images 20 and 21 are projected only onto the detector 8 as shown in FIG. 4(c), it is impossible to obtain any differential phase contrast image.

One conceivable method of solving the foregoing problems consists in mounting split detectors movably and rotatably and adjusting their positions and orientations relative to the diffraction images so that the separated diffraction images may be symmetrically projected on the split detectors. However, it is impossible to confirm how the diffraction images are projected onto the detectors and so no one knows how to adjust the positions and the orientations of the detectors. Consequently, it is difficult to put this method into practical use.

SUMMARY OF THE INVENTION

It is an objection of the present invention to provide a differential phase contrast scanning transmission electron microscope which enables the positions of split detectors to be easily and correctly adjusted relative to the positions of separated diffraction images, thus producing a clear differential phase contrast image.

The above object is achieved by a differential phase contrast scanning transmission electron microscope comprising: an electron beam source for producing an electron beam; a condenser lens for focusing the electron beam onto a specimen; a scanning means for causing the electron beam to scan the surface of the specimen in two dimensions; an image pickup means disposed in the path of the electron beam transmitted through the specimen; a lens means for projecting a diffraction image onto the electron incident surface of the image pickup means, the diffraction image being created from electrons transmitted through the specimen; an arithmetic means which divides the region covered by the image pickup means into plural parts by a predetermined boundary line and produces a signal indicating the difference between the amounts of electrons impinging on the parts; and a display means which displays an image of the specimen according to the differential signal from the arithmetic means.

In one feature of the invention, the electron microscope uses an image sensor as a detector for detecting an electron beam to permit the shapes and the positions of the diffraction images on the detector to be checked. Therefore, the plural regions can be precisely distinguished from each other. Hence, a clear differential phase contrast image can be obtained.

DETAILED DESCRIPTION OF THE INVENTION

Figure 1:
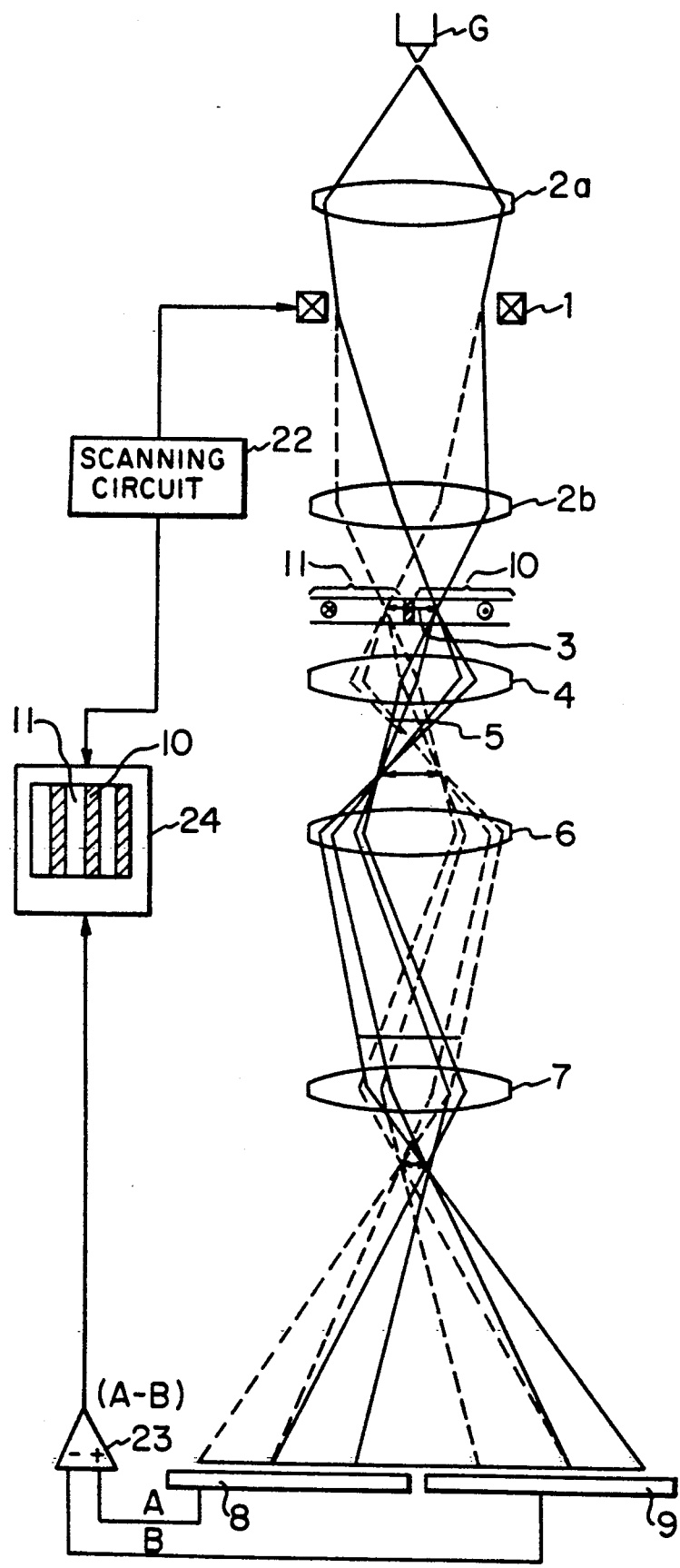
FIG. 1 is a diagram of a conventional scanning transmission electron microscope.
Figure 2:
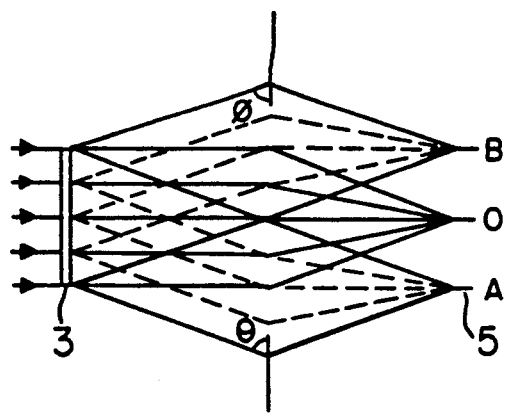
FIG. 2 is a diagram illustrating a diffraction image formed in the back focal plane 5 of an objective lens 4 of the microscope shown in FIG. 1.
Figure 3A:
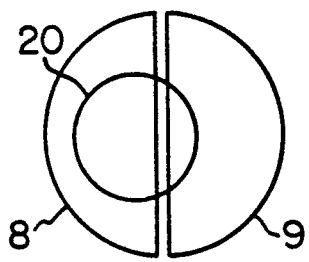
FIGS. 3(a) and 3(b) show diffraction images projected onto the detectors 8 and 9 shown in FIG. 1.
Figure 3B:
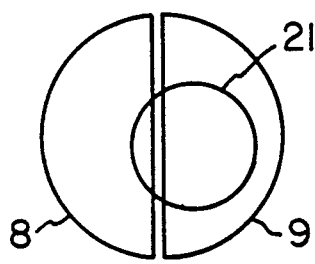
Figure 3C:
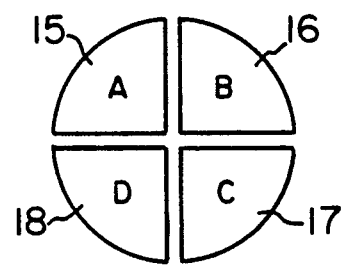
FIG. 3(c) is a representation of a detector split into four parts.
Figure 4A:
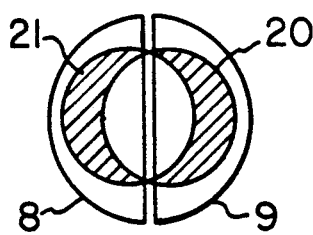
FIGS. 4(a), 4(b), and 4(c) are diagrams showing the positional relation of the detectors 8 and 9 shown in FIG. 1 to projected diffraction images.
Figure 4B:
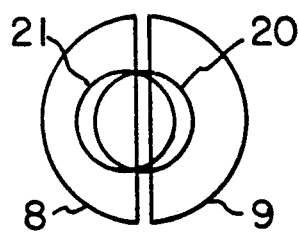
Figure 4C:
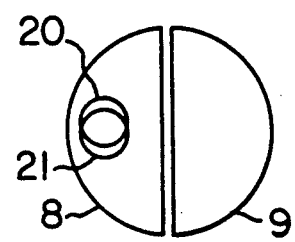
Figure 5:
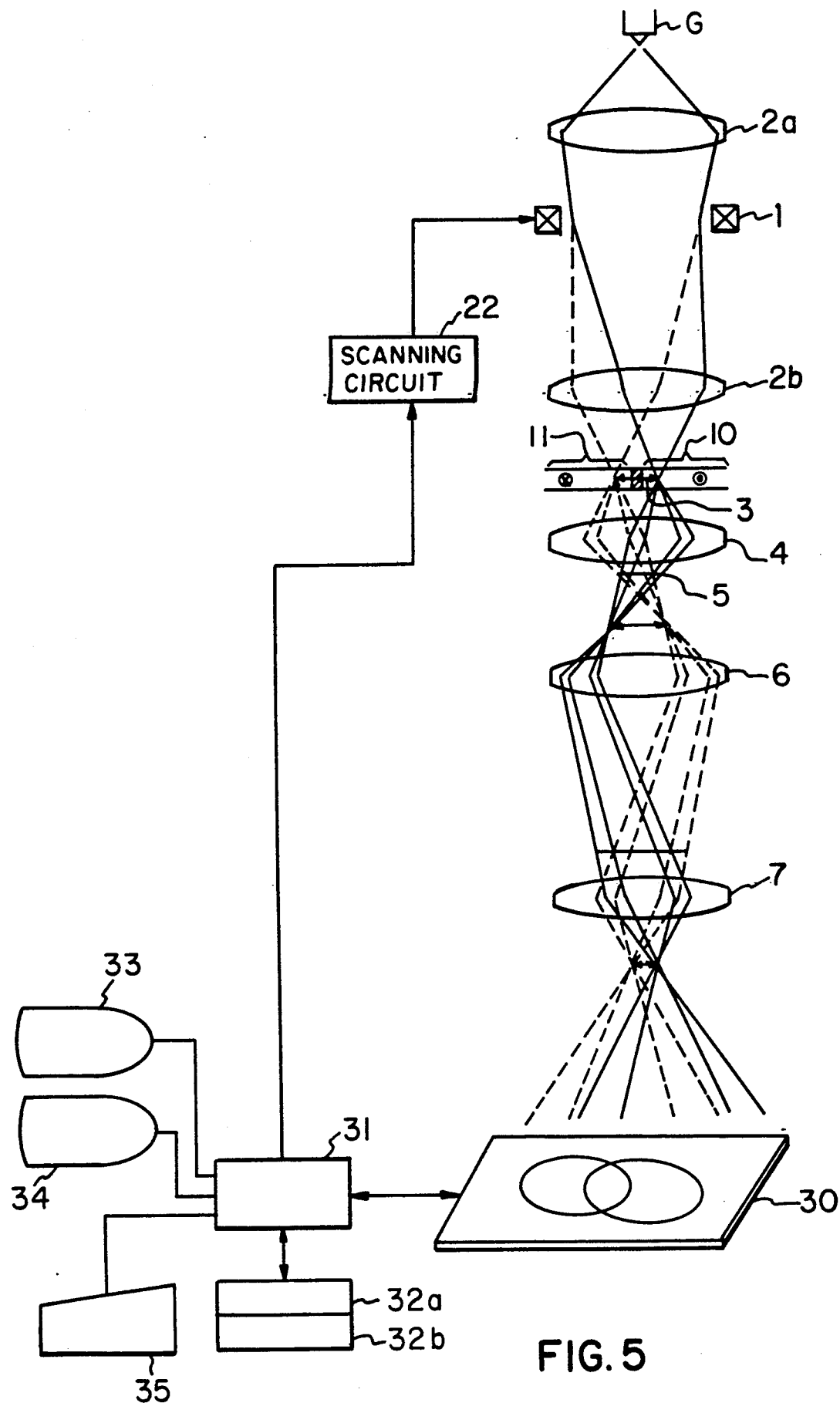
FIG. 5 is a block diagram of a scanning transmission differential phase contrast electron microscope according to this invention.

Referring to FIG. 5, there is shown a differential phase contrast scanning transmission electron microscope according to the invention. The electron optical system of this instrument is essentially the same as that of the instrument shown in FIG. 1. The novel instrument is equipped with an image sensor 30 instead of the detectors 8 and 9 shown in FIG. 1. As an example, the image sensor 30 consists of charge-coupled devices arranged in M rows and N columns. The microscope further includes a scanning circuit 22, a control unit 31 and frame memories 32a, 32b. The control unit 31 reads image information from the image sensor 30, processes the data, and stores it in the memories 32a and 32b. The control unit 31 comprises display units 33, 34, and an input device 35 such as a keyboard, a mouse, or a light pen.

Figure 6A:
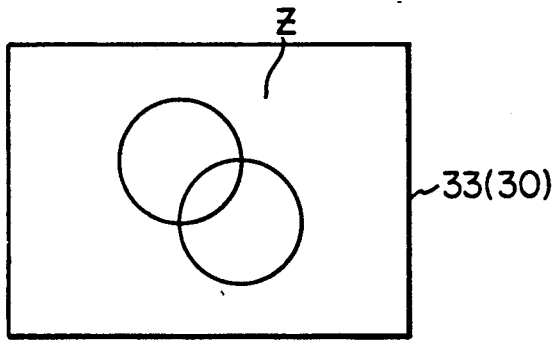
FIG. 6(a) is a view showing an image Z displayed on the image sensor 30 or display unit 33 shown in FIG. 5.
Figure 6B:
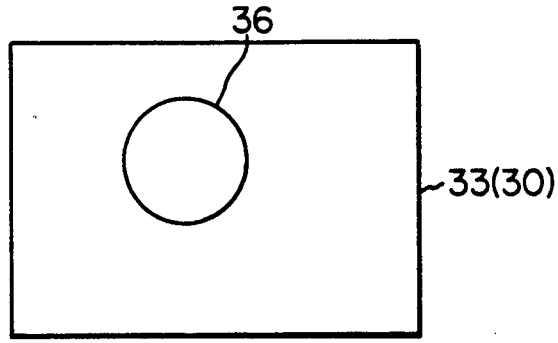
FIGS. 6(b) and 6(c) are views showing diffraction images projected onto the image sensor 30 or display unit 33 shown in FIG. 5.
Figure 6C:
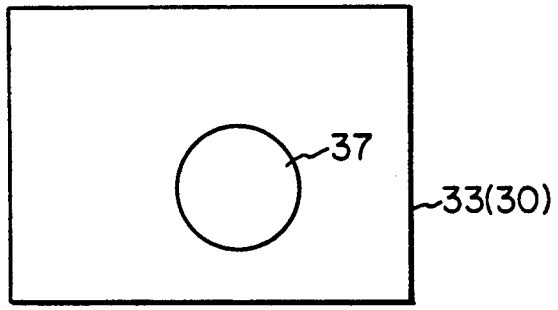

In the operation of the instrument constructed as described above, the instrument is first set to preparation mode. In this mode, the scanning circuit 22 causes the electron beam to scan one line or one frame on a specimen 3 under the instruction of the control unit 31. During this scan, electric charges falling on the individual CCDs of the image sensor 30 are stored in the CCDs. After this scan, the stored charges are read out as image data, converted into digital form, and stored in the frame memory 32a under the control of the control unit 31. The image data is also sent to the display unit 33 via the control unit 31. As a result, an image Z as shown in FIG. 6(a) is displayed on the viewing screen of the display unit 33. This image Z consists of two diffraction images 36 and 37 which are superimposed on each other. More specifically, during the scan of one line or frame, either the diffraction image 36 shown in FIG. 6(b) or the diffraction image 37 shown in FIG. 6(c) is projected onto the image sensor at each instant of time. The image sensor 30 stores the two diffraction images during the scan, whereby the image Z is obtained.

Figure 6D:
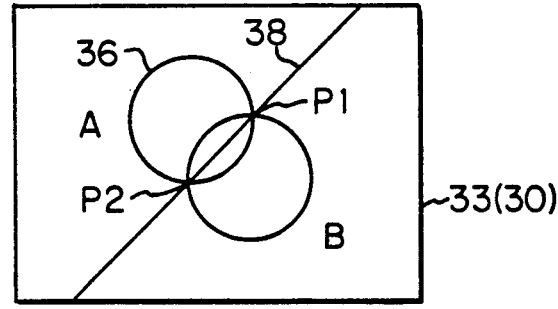
FIG. 6(d) is a view showing a boundary line superimposed on the image Z shown in FIG. 6(a)

The operator moves a cursor displayed on the viewing screen, using the input device 35, while observing the image Z, to specify the positions P1 and P2 of the intersections of the two diffraction images 36 and 37. The control unit 31 finds a straight line 38 connecting the two intersections from the data about the two specified positions. Then, as shown in FIG. 6(d), this line 38 is superimposed on the image Z and displayed. Thus, the preparation mode is completed.

The instrument then shifts to differential phase contrast image display mode. In this mode, the region covered by the image sensor 30 is divided into two regions A and B by the straight line 38. The two regions A and B are subsequently treated separately. The image data items which are read from the image sensor 30 are $M \times N$ in number. Of these data items, those data items which originate from the region A are accumulated. Also, those data items which are obtained from the region B are accumulated. Consequently, the image sensor 30 produces signals equivalent to the output signals from the two split detectors 8 and 9 of the prior art instrument shown in FIG. 1, the signals indicating the amounts of electric charges falling on the sensor.

Figure 7A:
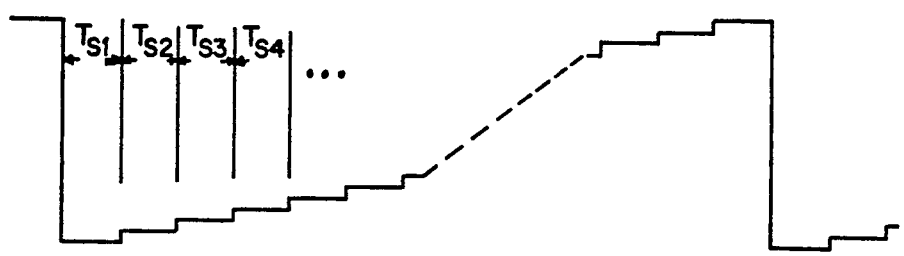
FIGS. 7(a) and 7(b) are diagrams illustrating horizontal and vertical scanning signals.
Figure 7B:
Figure 7C:
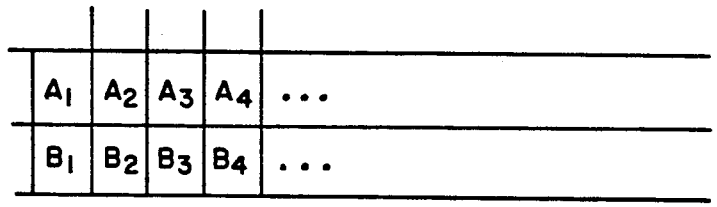
FIGS. 7(c) and 7(d) are diagrams illustrating the results of arithmetic operations performed by the control unit 31 shown in FIG. 5.
Figure 7D:

FIGS. 7(a) and 7(b) show the stepped horizontal and vertical scanning signals, respectively, sent from the scanning circuit 22 to the scan coil 1. In response to these scanning signals, each frame on the specimen 3 is scanned with the electron beam. Whenever the beam ceases on the specimen during a horizontal step change period such as Ts1, Ts2, or Ts3, M×N image data items are read from the image sensor 30 under the instruction of the control unit 31. These data items are accumulated by the control unit 31 for each different region as described above. As a result, data items A1, A2, A3, and so on about the amounts of impinging electric charges are derived from the region A in every step change period. Data items B1, B2, B3, and so one about the amounts of impinging electric charges are obtained from the region B in every retrace period, as shown in FIG. 7(c). The control unit 31 produces differential signals (A1−B1), (A2−B2), (A3−B3), and so on (FIG. 7(d) in the retrace periods. These differential signals are sent to the frame memory 32b and stored in it.

When the differential signal produced by a scan of one frame is stored in the frame memory 32a, the differential signals stored in the memory 32b are read out and fed to the display unit 34. Thus, the differential phase contrast image Z created from the differential signals is presented on the viewing screen of the display unit 34.

Figure 6E:
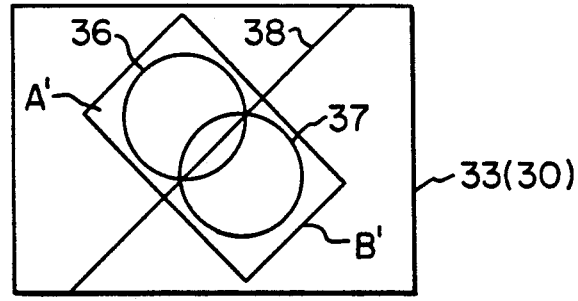
FIG. 6(e) is a view showing narrowed regions A' and B' about which accumulation operations are performed.

The background other than the diffraction images 36 and 37 on the display unit 33 shown in FIG. 6(a) should not, in principle, be irradiated with the electron beam. In practice, however, it is possible that unwanted electrons hit the background. Therefore, it is possible to reduce the adverse effects of unwanted electrons by limiting the regions handled by the control unit 31 to narrower regions A' and B' containing the diffraction images 36 and 37, respectively, as shown in FIG. 6(e).

Figure 8A:
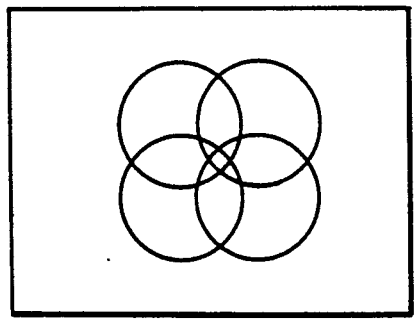
FIG. 8(a) is a view showing four diffraction images projected onto the image sensor 30 shown in FIG. 5.
Figure 8B:
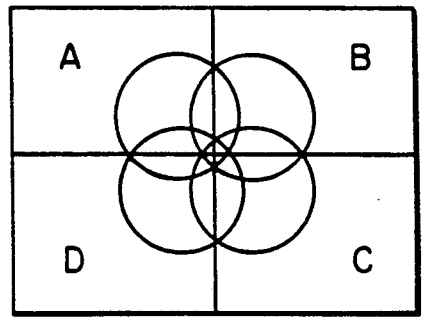
FIG. 8(b) is a view showing the manner in which the region covered by the image sensor 30 shown in FIG. 5 is divided into four by two straight lines.

In the description made thus far, it is assumed that only two diffraction images appear. Depending on the observed sample, four diffraction images might occur as shown in FIG. 8(a). In this case, the region covered by the image sensor 30 can be divided into four regions A, B, C, D by two straight lines in the preparation mode, as shown in FIG. 8(b). In the image display mode, the difference between signals indicating the amounts of charges on desired regions, e.g., A−B, A−C, C−D, or B−D, is produced. In this way, differential phase contrast images can be obtained by selecting various magnetization directions.

As described thus far, in accordance with the present invention, an image sensor is used to detect an electron beam. The region covered by the image sensor is arbitrarily divided. The amounts of electric charges falling on the divided regions, respectively, are calculated separately. The difference between the signals obtained from the different regions is calculated. Hence, a clear differential phase contrast image can be obtained.

It is to be noted that the present invention is not limited to the foregoing example, and that various changes and modifications may be made therein. For example, the image sensor is not limited to the type directly detecting an electron beam. An image sensor which converts an electron beam into light to detect electrons can also be utilized. In brief, any type of image sensor can be exploited, as long as it can substantially detect the pattern created by an electron beam.

Also in the above example, image data items read from the image sensor are accumulated by the control unit. Where a sensor producing accumulated image data is used, the control unit is not required to perform any accumulation operation.

Having thus described our invention with the detail and particularity required by the Patent Laws, what is claimed and desired to be protected by Letters Patent is set forth in the following claims.

What is claimed is:

1. A differential phase contrast scanning transmission electron microscope, comprising:
    an electron beam source for producing an electron beam;
    a condenser lens for focusing the electron beam onto a specimen;
    a scanning means for causing the electron beam to scan the surface of the specimen in two dimensions;
    a two-dimensional image pickup means disposed in the path of the electron beam transmitted through the specimen;
    a lens means for projecting a diffraction image onto the electron incident surface of the image pickup means, the diffraction image being created from electrons transmitted through the specimen;
    a means for superimposing at least two diffraction images which are created by the image pickup means when the electron beam impinges on the specimen surface in at least two different positions, respectively;
    a first display means which displays the superimposed diffraction image;
    an arithmetic means which divides the region covered by the image pickup means into plural parts by at least one arbitrarily moveable boundary line and produces a signal indicating the difference between the relative number of electrons impinging on the plural parts, respectively;
    an arbitrarily moveable pointing means for pointing positions on a viewing screen of said first display means which correspond to points of intersection between said diffraction images;
    means for establishing the position of said arbitrarily moveable boundary line according to the signal which indicates the positions pointed by said pointing means; and
    a second display means which displays an image of the specimen according to the differential signal from the arithmetic means and a signal related to the scanning means.

2. The differential phase contrast scanning transmission electron microscope of claim 1 further including:
    a means for displaying said arbitrarily moveable boundary line on a viewing screen of said first display means, said boundary line superimposed on said diffraction images and indicating the positions pointed by said pointing means.

3. A differential phase contrast scanning transmission electron microscope, comprising:
    an electron beam source for producing an electron beam;
    a condenser lens for focusing the electron beam onto a specimen;
    a scanning means for causing the electron beam to scan the surface of the specimen in two dimensions;
    a two-dimensional image pickup means disposed in the path of the electron beam transmitted through the specimen having a plurality of sensors arranged in columns and rows and output port means for reading each sensor when addressed by column and row;
    means for reading the sensors on the image pickup means;

a means for superimposing at least two diffraction images which are created by the image pickup means when the electron beam impinges on the specimen surface in at least two different positions, respectively;

computer means for establishing an arbitrarily moveable boundary line to divide the overlapping regions of said superimposed diffraction images;

computer means for separating the plurality of sensors into groups corresponding to regions on the image pickup device divided by said boundary line;

a first display means which displays said superimposed diffraction images;

an arbitrarily moveable pointing means for pointing positions on a viewing screen of said first display means which correspond to points of intersection between said diffraction images;

computer means for establishing said arbitrarily moveable boundary line according to the signal which indicates the positions pointed by said pointing means;

computer means for summing the outputs of all sensors in a given region and for mathematically combining the sums to produce signals indicating the difference in relative number of electrons impinging the regions; and a second display means which displays an image of the specimen according to a differential signal from the computer means for summing and a signal related to the scanning means.

4. The differential phase contrast scanning transmission electron microscope of claim 3, further including:

a means for displaying said arbitrarily moveable boundary line on a viewing screen of said first display means, said boundary line superimposed on said diffraction images and indicating the positions pointed by said pointing means.

* * * * *